United States Patent

Noto et al.

[11] Patent Number: 5,600,158
[45] Date of Patent: Feb. 4, 1997

[54] SEMICONDUCTOR LIGHT EMITTING DEVICE WITH CURRENT SPREADING LAYER

[75] Inventors: Nobuhiko Noto; Keizo Adomi; Takao Takenaka, all of Annaka, Japan

[73] Assignee: Shin-Etsu Handotai Co., Ltd., Tokyo, Japan

[21] Appl. No.: 514,628

[22] Filed: Aug. 14, 1995

[30] Foreign Application Priority Data

Sep. 22, 1994 [JP] Japan .................................. 6-228286

[51] Int. Cl.⁶ .................................................. H01L 33/00
[52] U.S. Cl. ............................ 257/94; 257/102; 257/103; 372/45; 372/46
[58] Field of Search .................................. 257/13, 94, 96, 257/97, 99, 102, 103; 372/45, 46

[56] References Cited

U.S. PATENT DOCUMENTS 5,048,035  9/1991  Sugawara et al. .......................... 372/45
5,466,950  11/1995  Sugawara et al. .......................... 257/94

FOREIGN PATENT DOCUMENTS

0301893A3  2/1989  European Pat. Off. .
0627772A2  12/1994  European Pat. Off. .

OTHER PUBLICATIONS

K. H. Huang, et al., "Twofold efficiency improvement in high performance AlGaInP light–emitting diodes in the 555–620 nm spectral region using a thick GaP window layer", 320 Applied Physics Letters 61 (9) 31 Aug., 1992 pp. 1045–1047.

Semiconductors and Semimetals, vol. 30, vol. Editor—Toshiaki Ikoma "Very High Speed Integrated Circuits: Heterostructure", pp. 208–211, 1990.

*Primary Examiner*—J. Carroll
*Assistant Examiner*—Minhloan Tran
*Attorney, Agent, or Firm*—Nikaido, Marmelstein, Murray & Oram LLP

[57] ABSTRACT

A semiconductor light emitting device comprising an n-type GaAs substrate, a light emitting layer portion consisting of an AlGaInP double heterojunction structure formed on the substrate, and a p-type current spreading layer formed on the light emitting layer portion, wherein the p-type current spreading layer comprises an undoped current spreading layer and a heavily-doped current spreading layer formed on said undoped current spreading layer. With this construction, it is possible to achieve a stable control of carrier concentration in a p-type cladding layer, to prevent deterioration of the interface between the p-type cladding layer and an active layer and also to prevent crystallinty-deterioration of the active layer with the result that the emission intensity of the device can be increased to a considerable extent.

8 Claims, 8 Drawing Sheets

5,600,158

SEMICONDUCTOR LIGHT EMITTING DEVICE WITH CURRENT SPREADING LAYER

BACKGROUND OF THE INVENTION

1. Field of the Invention

The present invention relates generally to semiconductor light emitting devices using compound semiconductor materials, and more particularly to a semiconductor light emitting device having a light emitting layer of AlGaInP grown on a GaAs substrate.

2. Description of the Prior Art

AlGaInP materials are direct transition-type materials with the largest bandgap energies among III–V compound semiconductor mixed crystals except nitrides and are receiving much attention as materials for visible light emitting devices in the 550–650 nm band (green to red region). The light emitting devices using the AlGaInP materials with such large direct bandgap energies can produce light emission with much higher brightness than the conventional ones using indirect transition-type materials such as GaP or GaAsP.

FIG. 5 of the accompanying drawings shows, in schematic cross section, one example of conventional AlGaInP light emitting devices. The conventional AlGaInP light emitting device 40 includes an n-type GaAs substrate 11 on which an n-type $(Al_xGa_{1-x})_{0.51}In_{0.49}P$ cladding layer 12 (about 1 micrometer thick), an $(Al_yGa_{1-y})_{0.51}In_{0.49}P$ active layer 13 (about 0.6 micrometers thick), a p-type $(Al_zGa_{1-z})_{0.51}In_{0.49}P$ cladding layer 14 (about 1 micrometer thick) and a p-type current spreading layer 15 (several micrometers thick) are formed successively one above the other. Provided on the top of the p-type current spreading layer 15 a p-side electrode (top electrode) 16, and on the bottom surface of the n-type GaAs substrate 11 an n-side electrode (bottom electrode) 17.

Here, the AlGaInP double heterojunction structure comprising the $(Al_yGa_{1-y})_{0.51}In_{0.49}P$ active layer 13 and the two AlGaInP cladding layers which have the bandgap energies larger than that of the active layer 13, i.e. the n-type $(Al_xGa_{1-x})_{0.51}In_{0.49}P$ cladding layer 12 and the p-type $(Al_zGa_{1-z})_{0.51}In_{0.49}P$ cladding layer 14, constitutes a light emitting layer portion 18, and the $(Al_yGa_{1-y})_{0.51}In_{0.49}P$ active layer 13 functions as a light emitting layer. In the AlGaInP double heterojunction structure, the ratios of Al composition, i.e. x, y and z, in the respective AlGaInP layers meet the following relationships: $0 \leq y \leq 0.7$, y<x and y<z.

In a description given below, unless otherwise mentioned specifically, the $(Al_xGa_{1-x})_{0.51}In_{0.49}P$, $(Al_yGa_{1-y})_{0.51}In_{0.49}P$ and $(Al_zGa_{1-z})_{0.51}In_{0.49}P$ will be referred generically to as "$(Al_BGa_{1-B})_{0.51}In_{0.49}P$" or simply to as "AlGaInP".

The above-described AlGaInP light emitting device requires a current spreading layer, and more specifically it requires a current spreading layer made of a material different from AlGaInP mixed crystals for a reason described below with reference to FIG. 5. In FIG. 5, current distribution 19 from the p-side electrode 16 is indicated by arrows.

In light emission of the AlGaInP light emitting device, it is desiable that a current from the p-side electrode 16 is spread effectively into the entire region of the AlGaInP active layer 13 to occur light-emission with high efficiency. To achieve this, it is required that the distance (layer thickness) between the p-side electrode 16 and the AlGaInP active layer 13 should be a prescribed value (several micrometers and more).

In the AlGaInP light emitting device, as shown in FIG. 5, the three AlGaInP layers 12 (about 1 micrometer thick), 13 (about 0.6 micrometers thick) and 14 (about 1 micrometer thick) are formed on the GaAs substrate 11 with the generic composition of $(Al_BGa_{1-B})_{0.51}In_{0.49}P$, wherein the AlGaInP layers are lattice-matched with the GaAs substrate 11. However, it is extremely difficult to form $(Al_{BGa1-B})_{0.51}In_{0.49}P$ mixed crystal layers of a total thickness exceeding 4 micrometers without causing deterioration of crystalline qualities.

That is, in order to spread the current effectively from the p-side electrode 16 into the entire region of the AlGaInP active layer 13, the thickness between the p-side electrode 16 and the active layer 13 must be several micrometers and more. However, formation of such a thick layer using AlGaInP materials is almost impossible because of the reason described above.

Therefore, conventionally it has been a practice to form a layer made of materials different from AlGaInP on the p-type AlGaInP cladding layer 14, as a current spreading layer 15, so that current from the p-type electrode 16 can be spread effectively into the entire region of the AlGaInP active layer 13 so as to insure efficient emission of light.

As materials for the p-type current spreading layer 15, an AlGaAs or an AlGaAsP or a GaP which is doped with a p-type dopant consisting of Zn, for example, at a high concentration (such as $3 \times 10^{18}$ atoms/cm$^3$) has been conventionally used.

In general, the double heterojunction structure of the AlGaInP light emitting device 40 is manufactured to have a p-type cladding layer 14 of about 1 micrometer in thickness. However, due to a high diffusion coefficient or diffusivity of Zn, such double heterojunction structure encounters a problem that during the growth of a p-type current spreading layer 15, heavily-doped Zn diffuses from the p-type current spreading layer 15 into the p-type cladding layer 14 and further into an active layer 13. Such diffusion of Zn as a p-type dopant causes (1) difficulty in achieving a stable carrier concentration control in the p-type cladding layer 14, (2) deterioration of the interface between the p-type cladding layer 14 and the active layer 13, and (3) crystallinity-deterioration of the active layer 13, which result in a reduction of the emission intensity of the light emitting device.

SUMMARY OF THE INVENTION

With the foregoing drawbacks of the prior art in view, it is an object of the present invention to provide a semiconductor light emitting device having structural features which make it possible to achieve a stable carrier concentration control of a p-type cladding layer, to prevent deterioration of the interface between the p-type cladding layer and an active layer and also to prevent crystallinity-deterioration of the active layer, thereby improving the light-emission intensity of the light emitting device.

To attain the foregoing object, the present invention provides a semiconductor light emitting device comprising an n-type GaAs substrate, a light emitting layer portion consisting of an AlGaInP double heterojunction structure formed on the substrate, and p-type current spreading layers formed on the light emitting layer portion, characterized in that the p-type current spreading layers comprise an undoped current spreading layer and a heavily-doped current spreading layer formed on the undoped current spreading layer.

As the undoped current spreading layer, a layer autodoped with carbon (C) is adopted wherein said layer is formed by means of MOVPE method (a metal organic vapor phase epitaxial method) under an undoped condition and at a ratio of supply of Group V element(s) to supply of Group III element(s) (V/III ratio) not greater than 30. In the MOVPE method, if AlGaAs or AlGaAsP or GaP, for example, is grown at a low V/III ratio, a p-type layer can be formed, as shown in FIG. 8, by virtue of autodoping of C even though the epitaxial growth is performed under the undoped condition. In addition, due to its extremely small diffusivity, C can diffuse little.

The undoped current spreading layer preferably has a thickness not less than 0.25 micrometers.

According to the construction of the present invention, there is disposed, between the p-type current spreading layer doped with Zn at a high concentration (of approximately $3 \times 10^{18}$ atoms/cm$^3$) and the p-type cladding layer, a layer which is of the p-type due to autodoping of C but is not doped with Zn. Owing to the presence of this layer (i.e., undoped current spreading layer), diffusion of Zn substantially takes place within the undoped current spreading layer, and the Zn diffusion to the p-type cladding layer and the active layer is limited to a considerable extent. In addition, C which is autodoped in the undoped current spreading layer has a very small diffusivity and hence does not diffuse into the p-type cladding layer and the active layer to such an extent as to influence the quality of them. This makes it possible to achieve a stable control of the carrier concentration in the p-type cladding layer without consideration about diffusion and to prevent deterioration of the interface between the p-type cladding layer and the active layer and crystallinity-deterioration of the active layer which affect the emission intensity of the light emitting device.

The above and other objects, features and advantages of the present invention will become manifest to those versed in the art upon making reference to the detailed description and the accompanying sheets of drawings in which a preferred embodiment incorporating the principles of the present invention is shown by way of illustrative example.

DETAILED DESCRIPTION OF THE INVENTION

AlGaInP light emitting devices according to the present invention will be described below in detail with reference to FIGS. 1 through 4.

Figure 1:
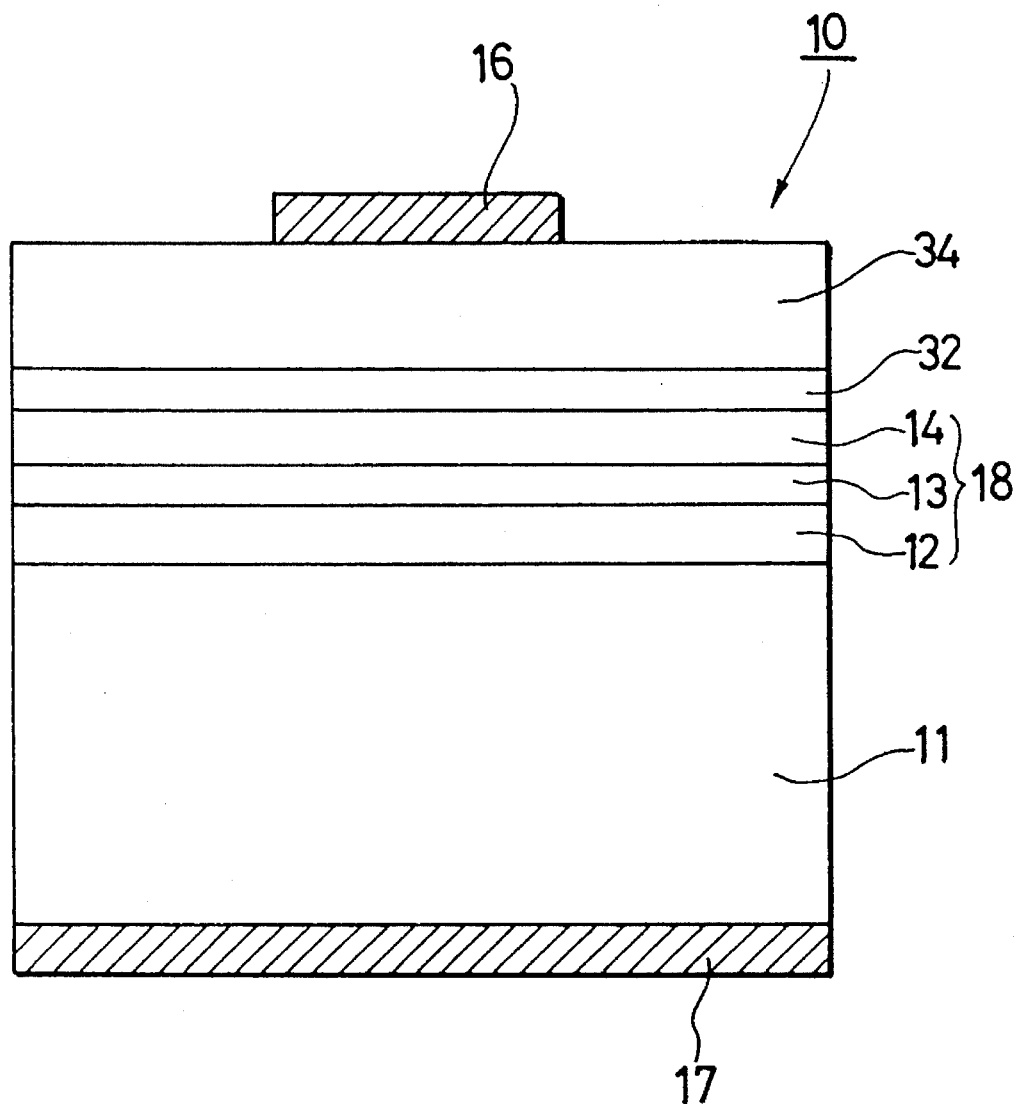
FIG. 1 is a diagrammatical cross-sectional explanatory view showing an embodiment of a semiconductor light emitting device according to the present invention.
Figure 5:
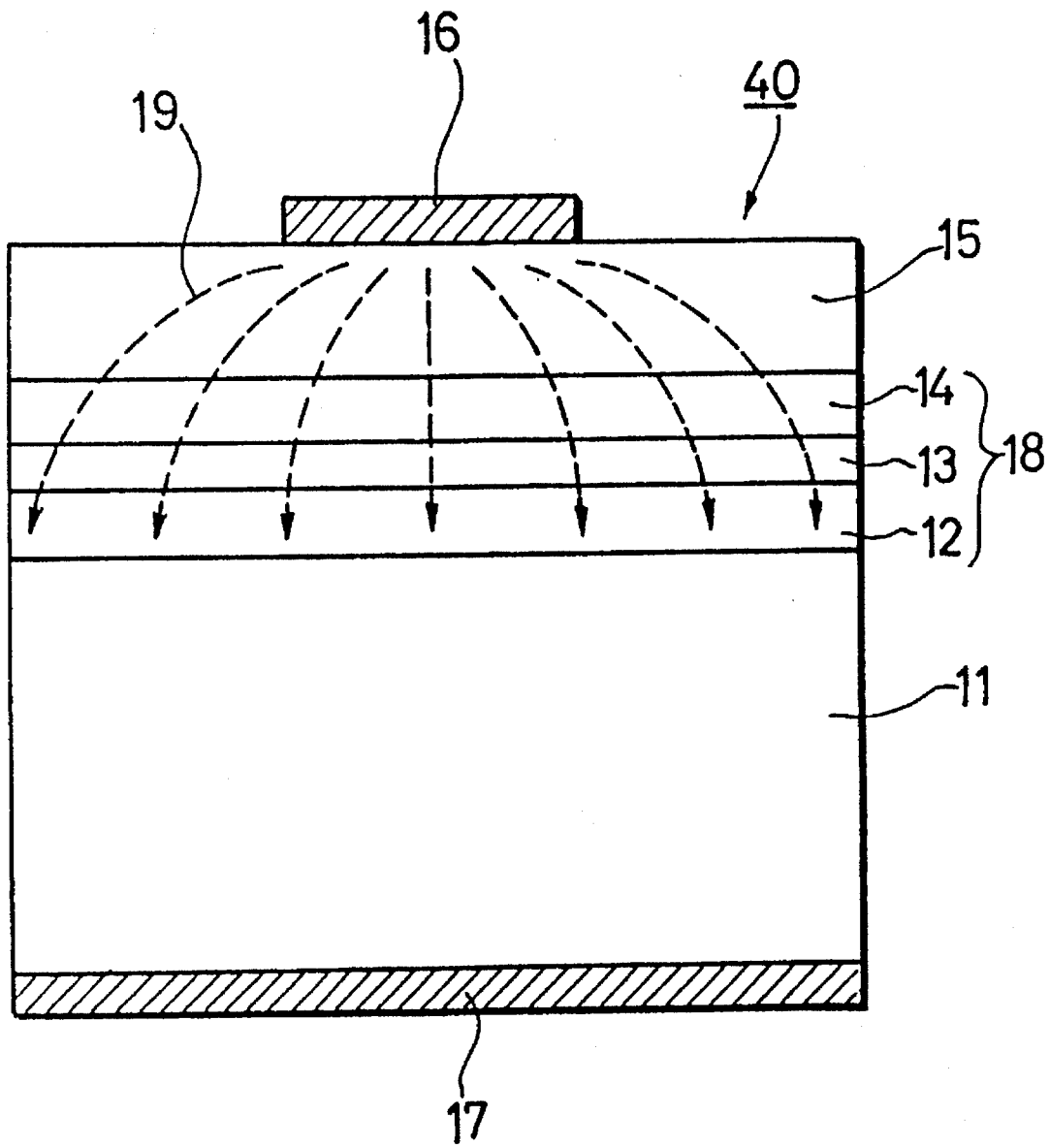
FIG. 5 is a diagrammatical cross-sectional explanatory view showing an example of a conventional semiconductor light emitting device.

FIG. 1 is a diagrammatical view showing, in cross section, an embodiment of the AlGaInP light emitting devices of the present invention. In FIG. 1, the parts which are the same as, or corresponding to, those shown in FIG. 5 are designated by the same or corresponding reference characters. The light emitting device, generally designated by 10, is constructed such that on an n-type GaAs substrate 11 are formed in succession an n-type $(Al_{0.7}Ga_{0.3})_{0.51}In_{0.49}P$ cladding layer 12 (of about 1 micrometer thick), an $(Al_yGa_{1-y})_{0.51}In_{0.49}P$ active layer 13 (of about 0.6 micrometers thick where $0 \leq y \leq 0.7$), a p-type $(Al_{0.7}Ga_{0.3})_{0.51}In_{0.49}P$ cladding layer 14 (of about 1 micrometer thick), subsequently, an undoped $Al_{0.7}Ga_{0.3}As$ current spreading layer 32 of about 0.5 micrometers thick and a Zn-doped p-type $Al_{0.7}Ga_{0.3}As$ current spreading layer 34 of about 10 micrometers thick are formed layerwise, and after that a p-side electrode 16 and an n-side electrode 17 are provided respectively on the top of the p-type current spreading layer 34 and on the bottom of the n-type GaAs substrate 11.

The layers of the AlGaInP light emitting device 10 are grown by means of the MOVPE method (the metal organic vapor phase epitaxial method). As the material sources for Al, Ga, In, As and P, trimethyl aluminum [Al(CH$_3$)$_3$, TMAl], trimethyl gallium [Ga(CH$_3$)$_3$, TMGa], trimethyl indium [In (CH$_3$)$_3$, TMIn], arsine (ASH$_3$) and phosphine (PH$_3$), respectively, are used. As the sources for the n-type dopant and the p-type dopant, hydrogen selenide (H$_2$Se) and dimethyl zinc [Zn(CH$_3$)$_2$, DMZn], respectively, are used.

Figure 2:
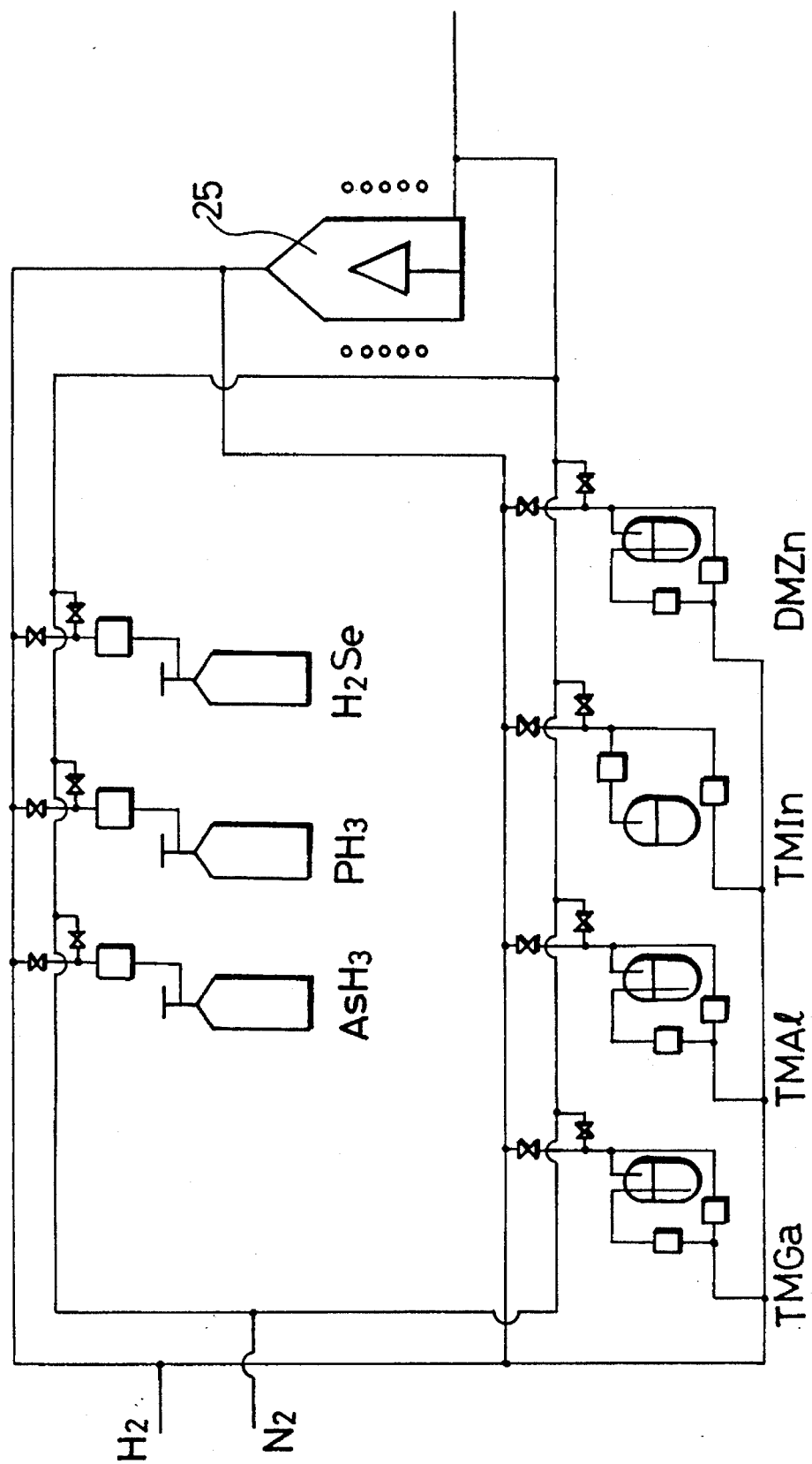
FIG. 2 is a diagrammatical explanatory view showing an embodiment of a growth system used for growing each layer of the semiconductor light emitting device by means of the MOVPE method.

FIG. 2 illustrates an embodiment of a growth system used for growing individual layers of the light emitting device 10 by means of the MOVPE method. In this growth system, various vapors of metalorganic compounds of Group III metals and hydride gases of Group V elements are mixed together and the obtained mixed-gas is supplied into a reaction chamber 25, with partial pressures and flow rates adjusted according to the compositions of the growth layers. And then the desired growth layers are formed successively one above another on the n-type GaAs substrate 11 which is placed in the reaction chamber 25.

EXAMPLE 1

The AlGaInP light emitting device 10 shown in FIG. 1 is fabricated in a manner described below concretely. Under a pressure of 50 Torr, the layers 12, 13 and 14 were epitaxially grown successively one above another on the n-type GaAs substrate 11, by supplying mixed source gases prepared in such a way that a supply ratio of the Group V element and the Group III elements (V/III ratio) is 100, with the following condition: a growth temperature of 710° C. and a growth rate of 4 micrometers/hour.

Figure 8:
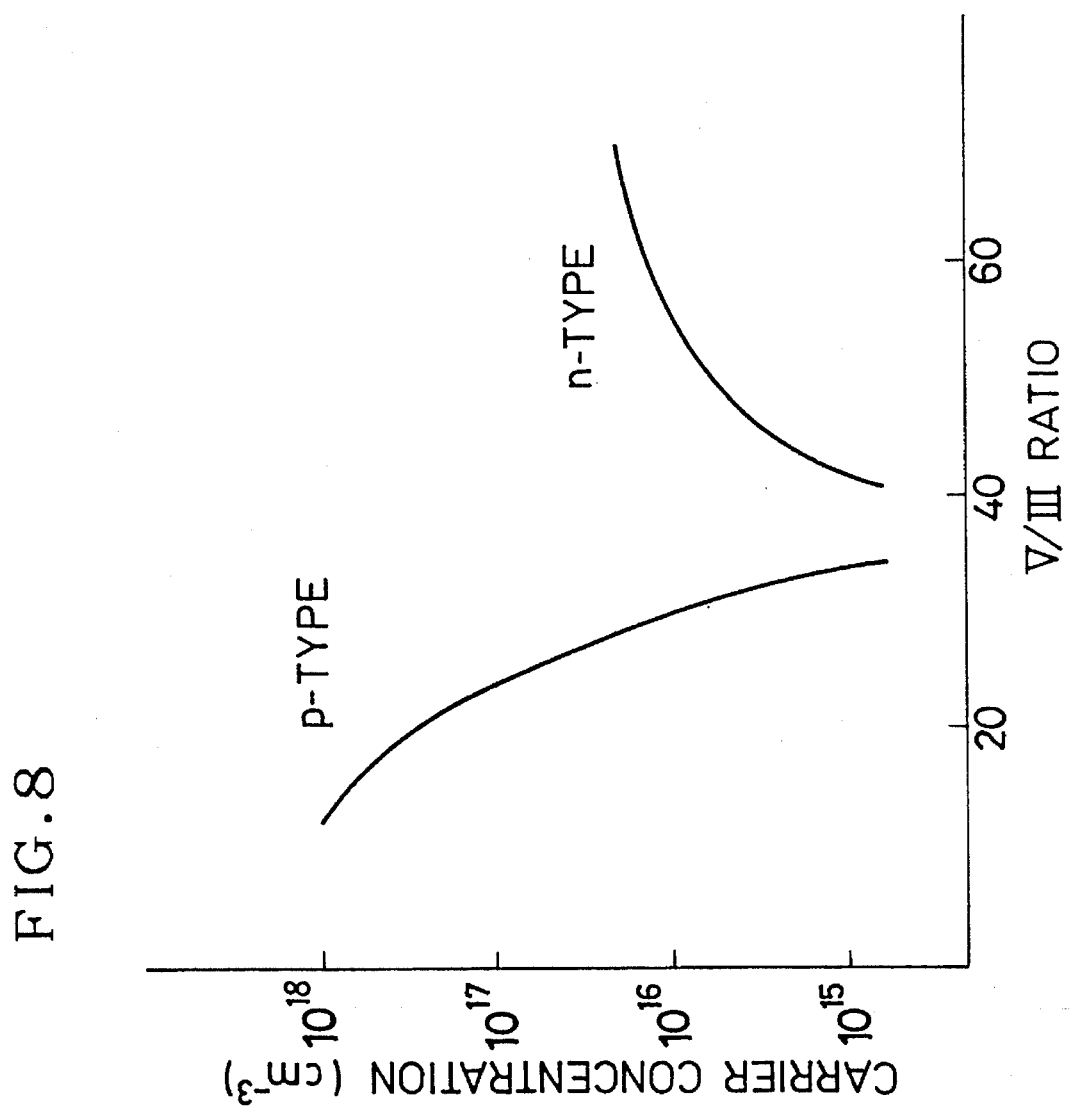
FIG. 8 is a graph showing the relationship between the V/III ratio and the carrier concentration, and the relationship between the V/III ratio and the conductivity type.

Subsequently, the material sources for Al, Ga and As were fed into the reacting chamber 25 for epitaxial growth of an undoped AlGaAs current spreading layer 32. At that time, gases of the Group V element (As) and the Group III elements (Al+Ga) mixed at a supply ratio (V/III ratio) of 20 were used as source gases. In the growth system used in the experiment, it had been confirmed that when the undoped AlGaAs current spreading layer 32 was grown under the aforesaid growth conditions (at the growth temperature of 710° C., at the growth pressure of 50 Torr, and at the V/III ratio of 20), the conductivity type was p and the carrier concentration was about $3\times10^{17}$ cm$^{-3}$ (see FIG. 8).

Thereafter, a p-type $Al_{0.7}Ga_{0.3}As$ layer 34 was formed by introducing the material source for Zn into the reaction chamber 25 concurrently with the introduction of the material sources for Al, Ga and As. At that time, in the same manner as the growth of the three layers 12, 13 and 14, gases so mixed as to attain a V/III ratio of 100 were used as source gases. An epitaxial wafer thus obtained was thereafter fabricated into AlGaInP light emitting devices 10 shown in FIG. 1.

COMPARATIVE EXAMPLE 1

Figure 6:
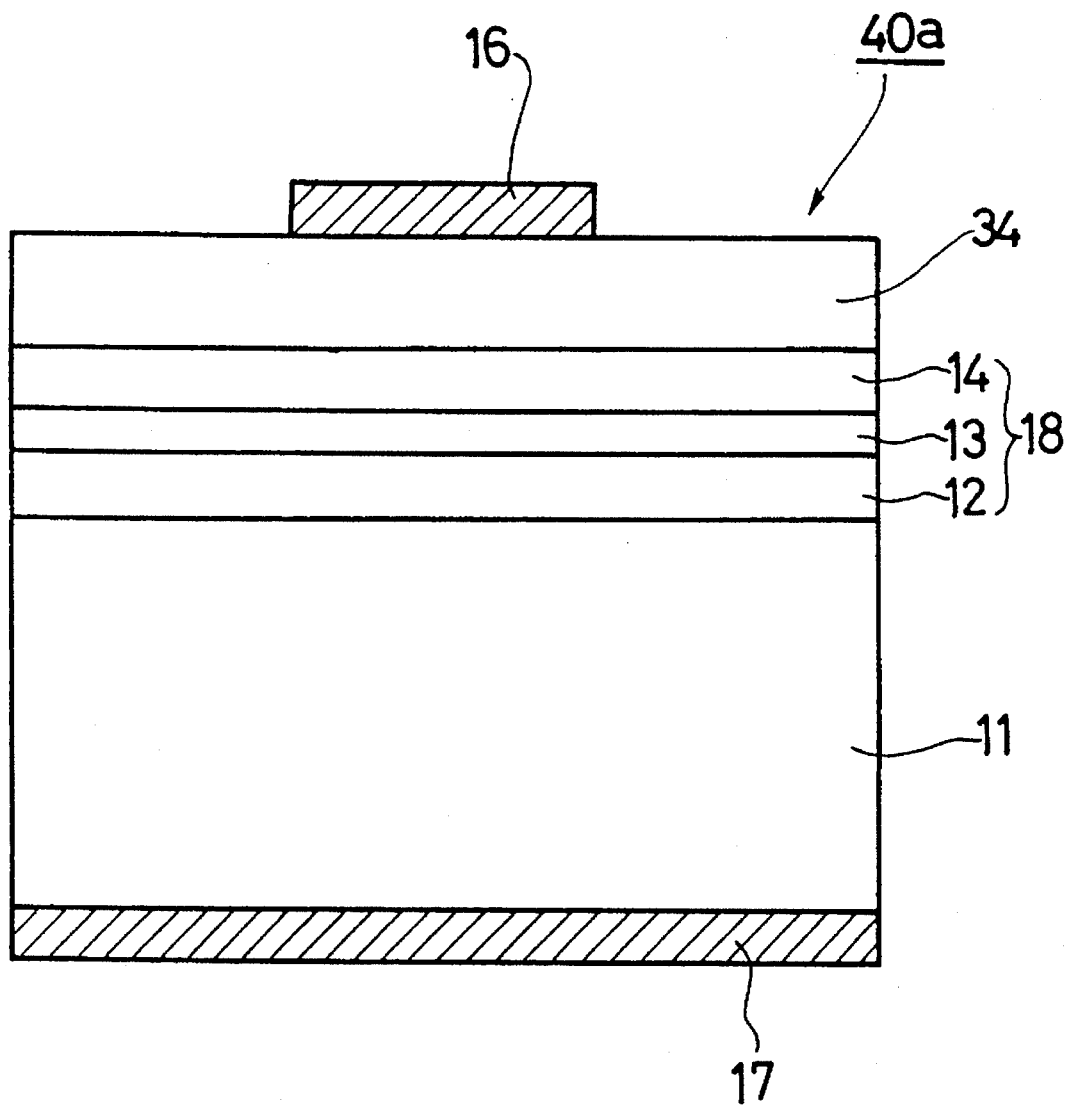
FIG. 6 is a diagrammatical cross-sectional explanatory view showing a semiconductor light emitting device according to Comparative Example 1.

FIG. 6 diagrammatically shows, in cross section, an AlGaInP light emitting device 40a in Comparative Example 1. In FIG. 6, the parts which are the same as, or corresponding to, those shown in FIG. 1 are designated by the same or corresponding reference characters. The AlGaInP light emitting device 40a of FIG. 6 is the same in construction as the AlGaInP light emitting device 10 of FIG. 1 with the exception that the undoped AlGaAs current spreading layer 32 is missing. All the layers 12, 13, 14 and 34 of the light emitting device 40a except the undoped AlGaAs current spreading layer 32 were each grown under the same condition as Example 1 described above.

Figure 3:
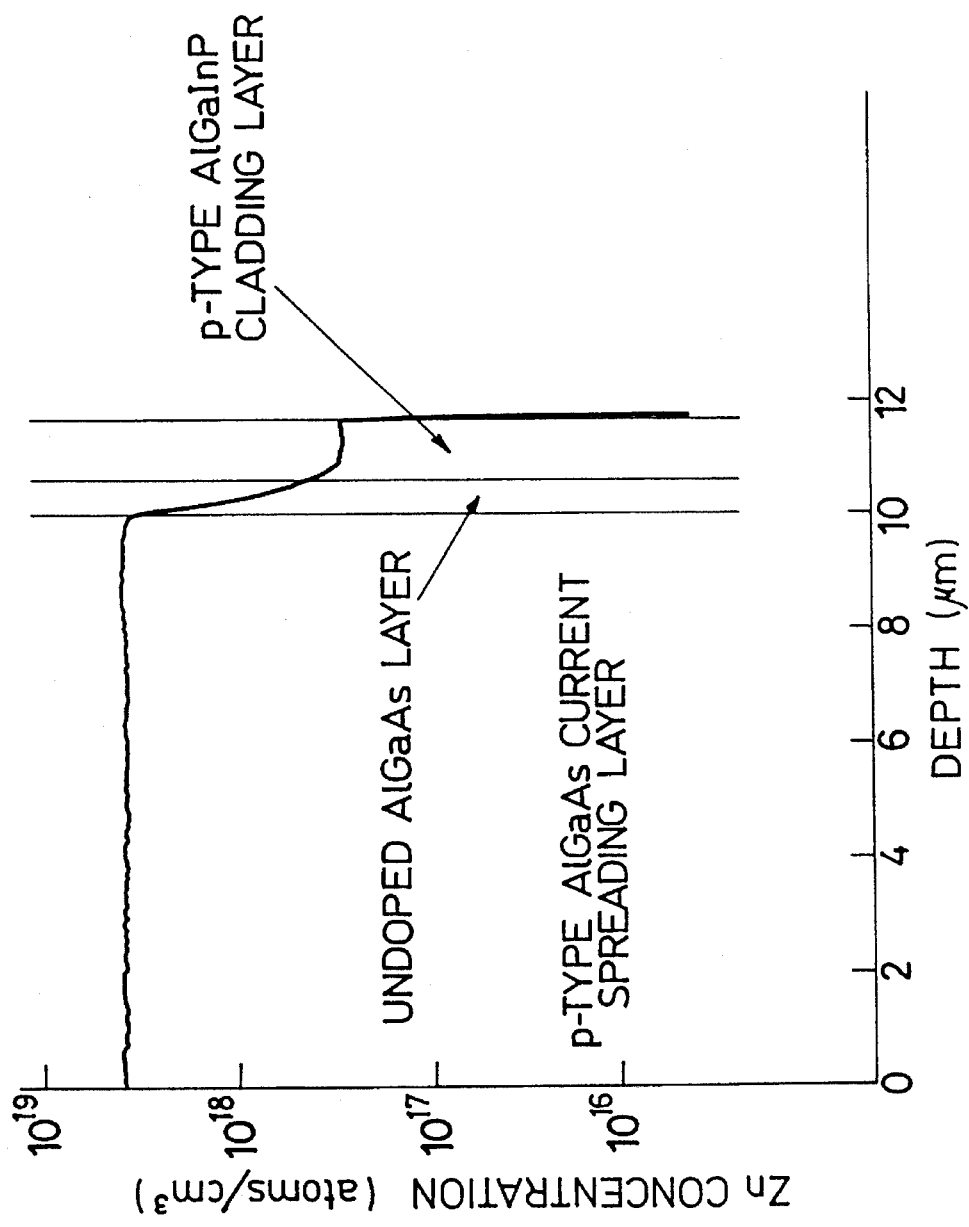
FIG. 3 is a graph showing the result of a Zn concentration analysis performed by means of the secondary ion mass spectroscopy (SIMS) in Example 1.
Figure 7:
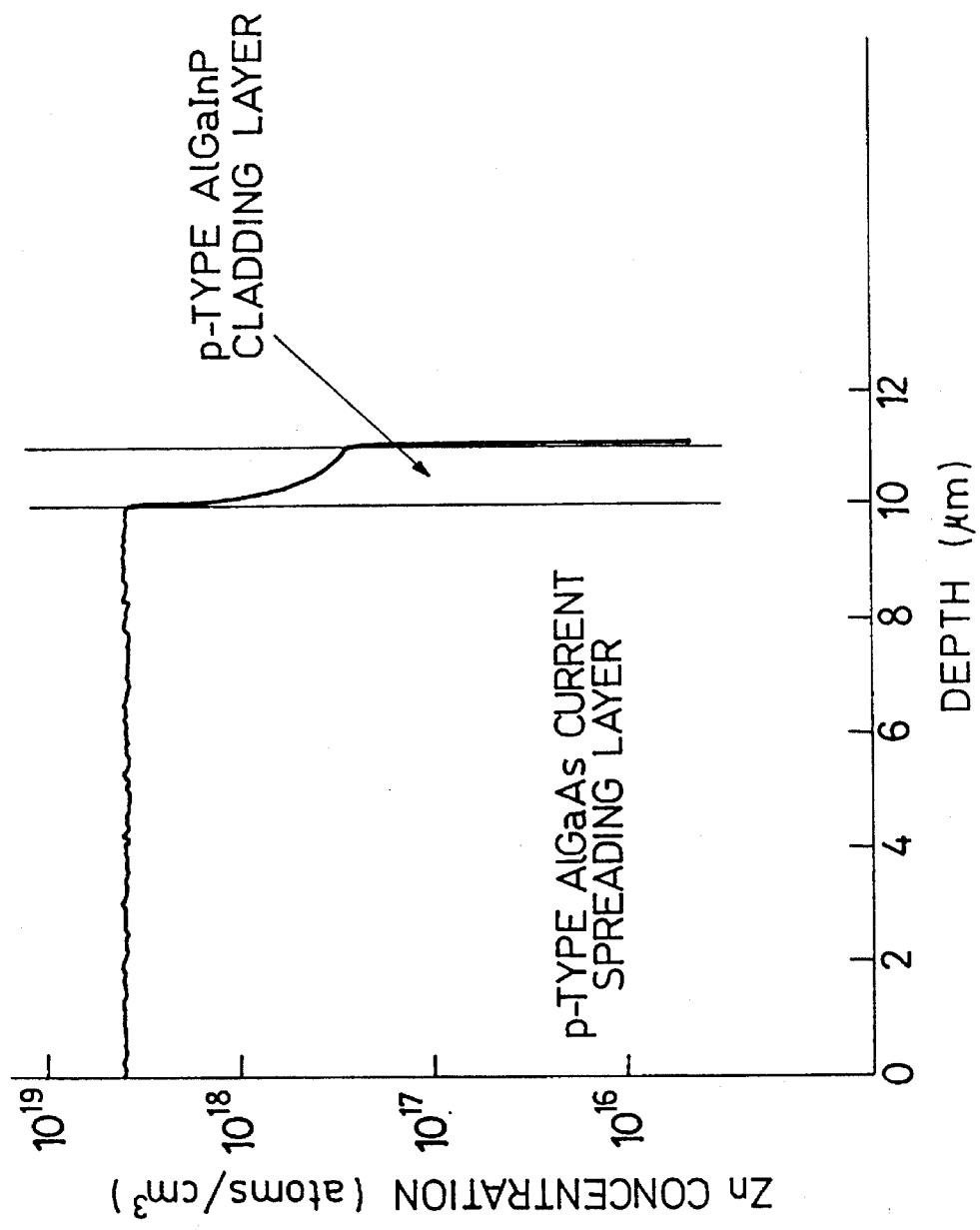
FIG. 7 is a graph showing the result of a Zn concentration analysis performed by means of SIMS in Comparative Example 1.

FIGS. 3 and 7 show the results of Zn concentration analyses of the AlGaInP light emitting device 10 of Example 1 and of the AlGaInP light emitting device 40a of Comparative Example 1, respectively, wherein Zn concentration analyses were performed by means of the secondary ion mass spectroscopy (SIMS). As shown in FIG. 7, according to the construction (shown in FIG. 6) of Comparative Example 1, Zn diffuses from the p-type AlGaAs current spreading layer 34, which is doped with Zn at high concentration, to the p-type AlGaInP cladding layer 14, and the Zn concentration in the p-type AlGaInP cladding layer 14 is not controlled at a desired doping level (of approximately $3\times10^{17}$ atoms/cm$^3$). Conversely, as is apparent from FIG. 3, according to the construction (shown in FIG. 1) of Example 1, Zn diffusion substantially takes place within the undoped AlGaAs current spreading layer 32, and the Zn concentration in the p-type AlGaInP cladding layer 14 is controlled at the desired level by doping.

Result of Evaluation of Light-emission Intensity

Figure 4:
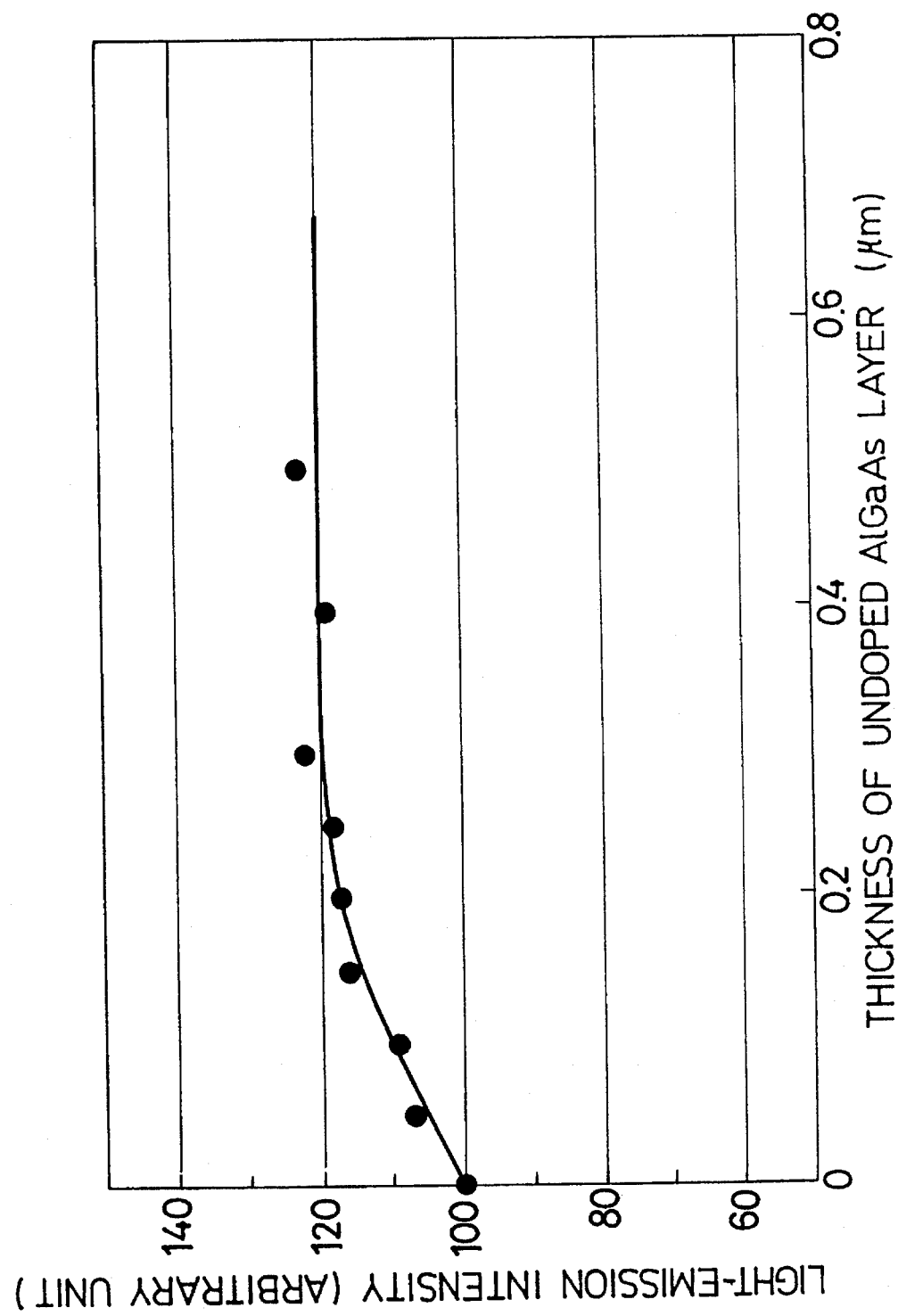
FIG. 4 is a graph showing the measured result of the emission intensities of AlGaInP light emitting devices wherein the thicknesses of the undoped AlGaAs current spreading layers are changed from 0 to 0.5 micrometers.

FIG. 4 is a graphical representation of the light-emission intensities of various AlGaInP light emitting devices having undoped AlGaAs current spreading layers 32 with different thicknesses varying from 0 micrometer (Comparative Example 1) to 0.5 micrometers, wherein the light-emission intensities are expressed in values relative to a standard obtained from the device without the undoped AlGaAs current spreading layer (Comparative Example 1). It appears clear from FIG. 4 that the light-emission intensity is increased by the undoped AlGaAs current spreading layer 32 provided according to the present invention, and more particularly, an about 20% improvement of the light-emission intensity can be achieved when the thickness of the undoped AlGaAs current spreading layer 32 is 0.25 micrometers and more. The usefulness of the present invention has thus been proved.

As described above, according to the semiconductor light emitting device of the present invention, it is possible to achieve a stable control of the carrier concentration in the p-type cladding layer, and to prevent not only deterioration of the interface between a p-type cladding layer and an active layer but also crystallinity-deterioration of the active layer which may be caused by diffusion of Zn. As a result, the emission intensity of the semiconductor light emitting device is considerably increased.

Obviously, various minor changes and modifications of the present invention are possible in the light of the above teaching. It is therefore to be understood that within the scope of appended claims the invention may be practiced otherwise than as specifically described.

What is claimed is:

1. A semiconductor light emitting device comprising an n-type GaAs substrate, a light emitting layer portion consisting of an AlGaInP double heterojunction structure formed on said substrate, and p-type current spreading layers formed on said light emitting layer portion, characterized in that said p-type current spreading layers comprise an undoped current spreading layer and a heavily-doped current spreading layer formed on said undoped current spreading layer.

2. A semiconductor light emitting device according to claim 1, wherein said undoped current spreading layer comprises a layer autodoped with carbon which is formed by means of a metal organic vapor phase epitaxial method under an undoped condition and at a ratio of supply of Group V element(s) to supply of Group III element(s) not greater than 30.

3. A semiconductor light emitting device according to claim 2, wherein said undoped current spreading layer comprises at least one material selected from group consisting of AlGaAs, AlGaAsP and GaP.

4. A semiconductor light emitting device according to claim 3, wherein said undoped current spreading layer has a thickness not less than 0.25 micrometers.

5. A semiconductor light emitting device according to claim 2, wherein said undoped current spreading layer has a thickness not less than 0.25 micrometers.

6. A semiconductor light emitting device according to claim 1, wherein said undoped current spreading layer comprises at least one material selected from the group consisting of AlGaAs, AlGaAsP and GaP.

7. A semiconductor light emitting device according to claim 6, wherein said undoped current spreading layer has a thickness not less than 0.25 micrometers.

8. A semiconductor light emitting device according to claim 1, wherein said undoped current spreading layer has a thickness not less than 0.25 micrometers.

\* \* \* \* \*